United States Patent [19]

Miki

[11] Patent Number: 5,091,956
[45] Date of Patent: Feb. 25, 1992

[54] ADAPTIVE HIGH PASS FILTER HAVING CUT-OFF FREQUENCY CONTROLLABLE RESPONSIVE TO INPUT SIGNAL AND OPERATING METHOD THEREFOR

[75] Inventor: Tsutomu Miki, Hyogo, Japan

[73] Assignee: Mitsubishi Denki Kabushiki Kaisha, Tokyo, Japan

[21] Appl. No.: 460,790

[22] Filed: Jan. 4, 1990

[30] Foreign Application Priority Data

Feb. 15, 1989 [JP] Japan ................................. 1-35411

[51] Int. Cl.⁵ .............................................. H03G 5/00
[52] U.S. Cl. ................................... 381/98; 333/28 T
[58] Field of Search ................ 333/14, 28 T; 381/106, 381/98, 103, 68.2

[56] References Cited

U.S. PATENT DOCUMENTS

| | | | |
|---|---|---|---|
| 4,498,055 | 2/1985 | Dolby | 333/14 |
| 4,507,791 | 3/1985 | Gundry | 333/14 |
| 4,700,361 | 10/1987 | Todd et al. | 333/14 |
| 4,701,722 | 10/1987 | Dolby | 333/14 |
| 4,790,018 | 12/1988 | Preves | 381/98 |

FOREIGN PATENT DOCUMENTS 62-51827  3/1987  Japan .

Primary Examiner—Forester W. Isen
Attorney, Agent, or Firm—Lowe, Price, LeBlanc & Becker

[57] ABSTRACT

An adaptive high pass filter comprises a switched capacitor filter (11) operable as a high pass filter, detecting circuits (14, 15, 16) for detecting low frequency signal components included in an input signal ($V_i$) and control circuits (17, 18, 19) for controlling the switched capacitor filter (11) responsive to the detecting circuits. In this adaptive high pass filter, a cut-off frequency thereof is controlled responsive to low frequency signal components of the input signal. Therefore, a reproduced voice is not varied dependent upon changes in a quality of voice and surrounding environments. Thus, the reproduced voice is much closer to its original voice.

13 Claims, 4 Drawing Sheets

ADAPTIVE HIGH PASS FILTER HAVING CUT-OFF FREQUENCY CONTROLLABLE RESPONSIVE TO INPUT SIGNAL AND OPERATING METHOD THEREFOR

BACKGROUND OF THE INVENTION

1. Field of the Invention

The present invention is particularly applicable to digital processing technology for sounds. The present invention relates generally to adaptive high pass filters, and more particularly to an adaptive high pass filter having a cut-off frequency controllable responsive to a low band signal included in a sound input signal.

2. Description of the Background Art

As examples of a communication system employing a satellite communication, the following systems are known such as a telephone communication system, an answering machine system and a voice mail system. In the satellite communication, a frequency usable for the communication is required to have a narrow bandwidth. A description will be given on sound signal processing applicable to the communication generally known and for other uses.

FIG. 5A is a block diagram of the configuration of a conventional sound signal processing apparatus. Referring to FIG. 5A, this sound signal processing apparatus comprises a microphone 1 which converts a sound to a sound signal, an amplifier 2 which amplifies the sound signal, a high pass filter (hereinafter referred to as HPF) 3c for removing a low band component of the amplified sound signal, a low pass filter (hereinafter referred to as LPF) 4 for removing a high band component of the amplified sound signal, an A/D converter 5, a memory portion 11 for storing the A/D-converted sound signal, and a control portion 6. In addition, this sound signal processing apparatus further comprises, as a circuit for reproducing the sound, a D/A converter 7 which D/A-converts the signal stored in the memory portion 11, an LPF 8 which removes the high band component of the D/A-converted signal, and an amplifier 9 and a loudspeaker 10.

In general, the sound signal is quantized by the A/D converter so as to store the signal into the memory device. When the maximum frequency of the signal component included in an input signal is denoted as $f_{i(max)}$, a sampling frequency $f_s$ to be used for quantization needs to satisfy the following inequality according to a sampling theorem.

$$f_s \geq 2 \cdot f_{i(max)} \quad (1)$$

When the sampling frequency $f_s$ is set in the A/D converter if the $f_s$ is not set in accordance with the inequality (1), the signal components of the input signal, which exceed the frequency $f_s$, is controllable to noise among those involved in the input signal. This noise is known in the art as alias noise. Therefore, as shown in FIG. 5A, the LPF 4 is provided at the preceding stage of the A/D converter to remove the signal components exceeding the frequency $f_s$ of the input signal.

If the sound signal having only the high band components of its input signal cut off by the LPF 4 is A/D-converted, the sound signal obtained by D/A conversion is proceeded to have its low band signal components relatively emphasized. That is, the sound obtained from the sound signal becomes unclear, or becomes poorly articulated. Accordingly, the HPF 3c is provided at the further preceding stage of the A/D converter 5 to obtain a clear or well-articulated sound, so that the low band signal components of the sound signal are also cut off by the HPF 3c.

The operation of the sound signal processing apparatus illustrated in FIG. 5A will now be described briefly. The sound signal obtained from the microphone 1 is amplified by the amplifier 2. The HFP 3c removes the signal components of the frequencies lower than the cut-off frequency from the amplified sound signal. The LPF 4 removes the signal components of the frequencies higher than the cut-off frequency from the output signal of the HPF 3c. The A/D converter 5 A/D-converts the output signal of the LPF 4. The control portion 6 compresses the amount of information corresponding to the signals quantized by the A/D converter 5 to store the compressed data in the memory portion 11.

FIG. 5B shows a useful frequency band limited by the HPF 3c and the LPF 4 in the case of application of the sound signal processing apparatus in FIG. 5A to the telephone system. In this figure, the notation $f_{CH}$ represents the cut-off frequency of the HPF 3c and is set to approximately 300 Hz. Meanwhile, the $f_{CL}$ represents the cut-off frequency of the LPF 4 and is set to approximately 3.4 KHz. The cut-off frequencies $f_{CH}$ and $f_{CL}$ are both determined by an experiment. In order to prevent an occurrence of alias noise, the signal components exceeding the cut-off frequency $f_{CL}$ should be removed by band compression. Adaptive Differential Pulse Cord Modulation (hereinafter refereed to as ADPCM) is known as a typical band compression.

When the sound signal including the signal components of 4 KHz or less is processed, for example, the sampling frequency $f_s$ attains 8 KHz. When the sound data is A/D-converted at the speed of 8 bit/sec, for example, a transmission speed of 64 Kbit/sec is required. Thus, due to the application of the ADPCM, the transmission speed of the data to be transmitted is compressed to 32 Kbit/sec.

In reproduction processing of the sound signal, the control portion 6 supplies the data stored in the memory portion 11 to the D/A converter 7 with appropriate decompression if the data has been previously compressed. The data is D/A converted by the D/A converter 7 to be supplied to the LPF 8. The signal fed by the LPF 8 is applied to the amplifier 9 after the high band components are removed thereby. The sound signal amplified by the amplifier 9 is output as a sound via the loudspeaker 10.

FIG. 6 is a block diagram illustrating the configuration of a conventional sound signal processing system. As shown in FIG. 6, two sound signal processing apparatuses are connected via a transmission path 12 such as a digital signal line in the sound signal processing system. Each of these sound signal processing apparatuses is identical to the one whose memory portion 11 is removed from the apparatus shown in FIG. 5A. The FIG. 6 illustrates an example, in which the sound data is not only stored in the memory but also transferred via the transmission path 12.

As shown in FIGS. 5A and 6, the HPF 3c and LPF 4 are provided at the preceding stage of the A/D converter 5 in each of the conventional sound signal processing apparatuses. The LPF 4 has a filter characteristic, which is predetermined in order to prevent the alias noise determined by the sampling frequency $f_s$ of the A/D converter 5. The conventional HPF 3c also has its filter characteristic predetermined. Since the filter characteristic of the HPF 3c is fixed, the low band signal components of the sound signal, depending on only the low frequency band signal components of the input signal, cannot be adaptively removed by the HPF 3c when the signal frequency components included in the sound signal vary depending upon a speaker, a sound field, such as relative positioning of a sound source and a microphone, and microphone characteristic acoustics. For example, the signal frequency components included in the sound signal vary depending on whether the speaker would be male or female. Also, absorption of the low band components of the sound tends to occur in an environment where reverberation easily occurs. In such a case, if removal of the low band components of the sound signal is fixedly performed by the HPF 3 having a fixed filter characteristic, a sound digital signal obtained after A/D conversion is not properly controlled. This causes degradation in a tone quality of the sound obtained by the reproduction processing.

An example of the prior art of particular interest to this invention is seen in Japanese Laying Open No. 62-51827. This art discloses a sound encoding system related to band compression for decreasing the amount of the quantized sound signal to be transmitted. This sound encoding system includes a filter having a variable characteristic, but the characteristic of this filter is not changed responsive to the input signal. In addition, it should be noted that this art is related to the band compression, while the present invention relates to pre-processing for the sound signal.

SUMMARY OF THE INVENTION

One object of the invention is to provide an adaptive high pass filter having a cut-off frequency controllable responsive to a low frequency signal component included in an input signal.

Another object of the invention is to provide an adaptive high pass filter having a cut-off frequency controllable responsive to a low frequency signal component included in an electrically applied input sound signal.

In short, an adaptive high pass filter of the present invention comprises a high pass filter circuit connected to receive a sound input signal and having a controllable cut-off frequency, an extraction circuit for extracting the power of a low frequency signal component included in the input signal, and a control circuit for controlling the cut-off frequency of the high pass filter responsive to the extraction circuit. In operation, the cut-off frequency of the high pas filter circuit is adaptively controlled responsive to a low frequency signal component included in the input signal. Therefore, the low band component of the input signal is removed according to the power of the low band signal component included in the input signal.

In one aspect, a digital audio frequency signal processing system for processing an audio frequency signal according to the present invention, includes an analog-to-digital converter having a sampling frequency, a low pass filter for limiting the bandwidth of the audio frequency signal input thereto to a frequency sufficiently lower than the sampling frequency, and a high pass filter comprising a voltage controllable cut-off frequency filter for altering the cut-off frequency thereof in response to the low frequency energy content of the audio frequency signal. In operation, the high frequency components and low frequency components of the audio frequency signal are adaptively balanced.

A method, according to the present invention, for adaptively balancing high frequency and low frequency energy components of an audio frequency signal in a digital audio frequency signal processing circuit having an analog-to-digital converter and a controllable cut-off frequency high pass filter, including the steps of: generating a signal having parameter proportional to the magnitude of the low frequency energy component of the audio frequency signal, and altering the cut-off frequency of the controllable cut-off frequency high pass filter in response to the parameter of the analog signal proportional to the low frequency energy component of the audio frequency signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
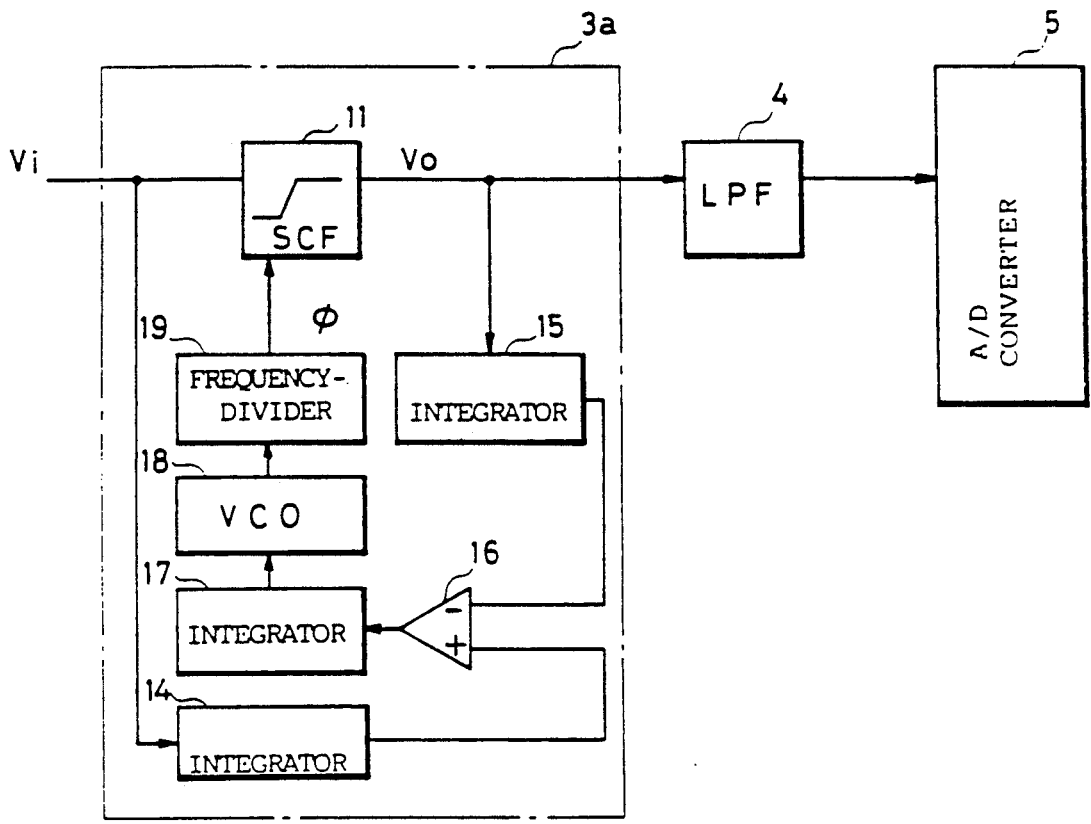
FIG. 1 is a block diagram illustrating one embodiment of an adaptive high pass filter of the present invention.

Referring to FIG. 1, the adaptive high pass filter 3a comprises a switched capacitor filter 11 (hereinafter referred to as SCF), which is connected to receive a voice input signal $V_i$, an integrator 14 for integrating the input signal $V_i$, another integrator 15 for integrating an output signal $V_o$ of the SCF 11, a subtractor 16 for subtracting the output signals from the integrators 14 and 15, another integrator 17 for smoothing an output signal from the subtractor 16, a voltage controlled oscillator 18 (hereinafter referred to as VCO), which operates responsive to the output signal of the integrator 17, and a frequency divider 19 which frequency-divides the output signal of the VCO 18. A clock signal $\phi$ output from the frequency divider 19 is supplied to the SCF 11, and the SCF 11 operates responsive to the clock signal $\phi$.

Figure 2A:
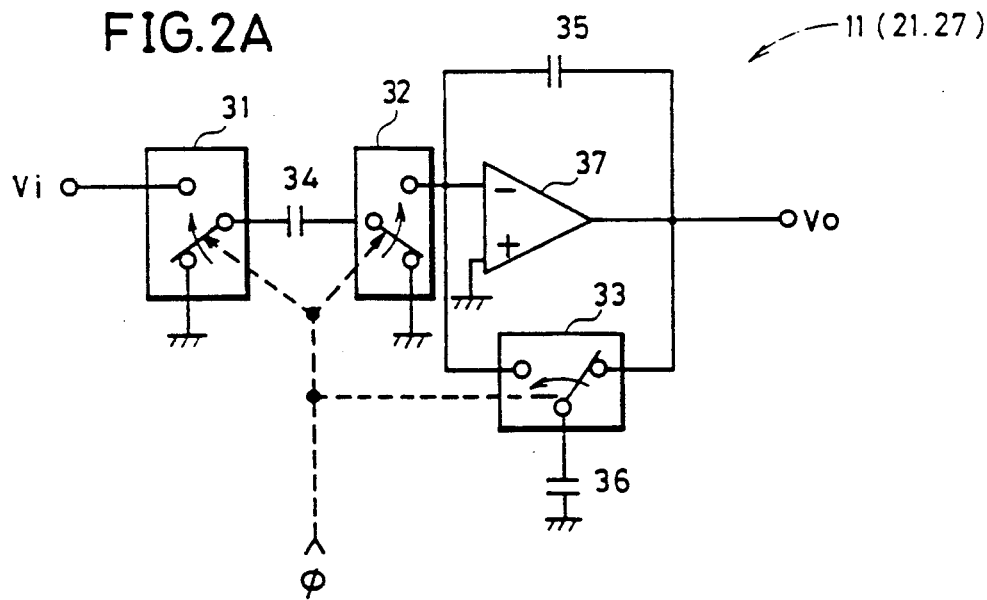
FIG. 2A is a circuit diagram illustrating an example of a switched capacitor filter shown in FIG. 1.

Referring to FIG. 2A, this SCF 11 comprises three switching devices 31, 32 and 33, three capacitors 34, 35 and 36, and a differential amplifier 37. The switching devices 31, 32, 33 operate responsive to the clock signals φ provided by the frequency divider 19. A high resistance circuit comprises the switching devices 31, 32, the capacitor 34 connected between them, and the switching device 33. A switched capacitor circuit is formed of the high resistance circuit and the capacitor 36. An integrating circuit comprises the differential amplifier 37 and the capacitor 35 connected between the inverting input terminal and the output terminal of the differential amplifier.

The SCF 11 shown in FIG. 2A is employed as a high pass filter in the adaptive high pass filter 3a shown in FIG. 1. Assuming that a capacitance value of the capacitor 35 is $C_1$, and that of the capacitor 34, 36 is $C_2$, the following expressions (2) and (3) need be satisfied in order to operate the SCF 11 shown in FIG. 2A as a high pass filter.

$$C_2 = (1-b) \times C_1 \quad (2)$$

$$b < 0 \text{ and } 0 < |b| < 1 \quad (3)$$

By providing in the SCF 11 the capacitors 34, 35, 36 which satisfy the expressions (2) and (3), the high pass filter is obtainable whose cut-off frequency is controlled depending on the frequency of the clock signal φ.

Again referring to FIG. 1, the operation of the adaptive high pass filter 3a will be described. The voice input signal $V_i$ is supplied to the integrator 14. Therefore, a signal indicating the power or energy of the input signal $V_i$ is output from the integrator 14 to one input of the subtractor 16. On the other hand, the output signal $V_o$ of the SCF 11 is applied to the integrator 15. Since the signal $V_o$ has its low band components removed by the SCF 11, a signal indicating the high band power or energy of the input signal $V_i$ is output from the integrator 15 to the other input of the subtractor 16. Consequently, the subtractor 16 outputs a signal indicating the low band power or energy of the voice input signal Vi and supplies the same to the integrator 17.

The integrator 17 smoothes the supplied signal by integrating operation thereof and then applies the smoothed signal to the VCO 18. The VCO 18 generates a clock signal responsive to the signal applied by the integrator 17. After the clock signal generated is frequency-divided by the frequency divider 19, the output is provided to the SCF 11 as a clock signal φ for controlling the cut-off frequency of the SCF 11.

Figure 2B:
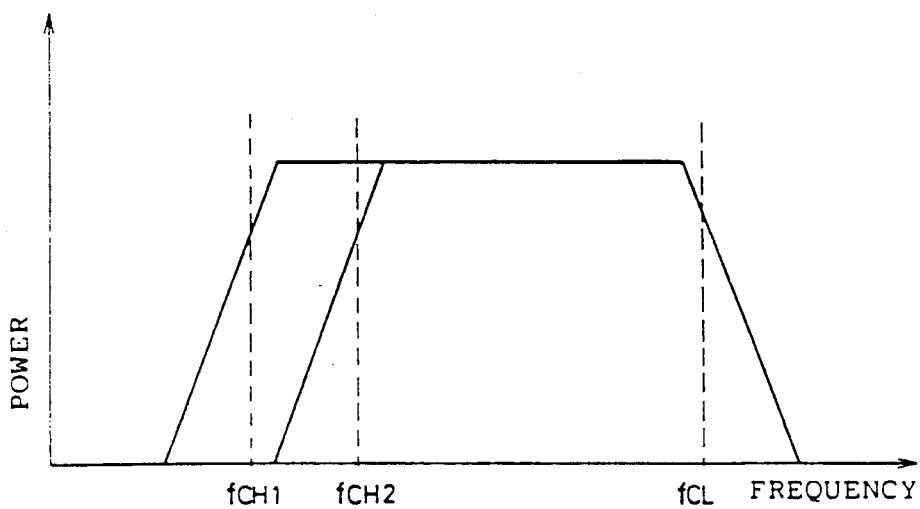
FIG. 2B is a characteristic diagram showing a characteristic of a frequency band controlled by the adaptive high pass filter and a low pass filter shown in FIG. 1.

The output signal of the subtractor 16 is proportional to the power or energy of the low frequency signal components included in the sound input signal. The VCO 18 outputs a clock signal having an oscillating frequency proportional to a supplied input voltage. The cut-off frequency of a high pass filter of the SCF 11 varies in proportion to the frequency of the clock signal φ applied by the frequency divider 19. Therefore, when the power or energy of the low band frequency components included in the input signal is high, the cut-off frequency of the SCF 11 goes high, and the low band signal components of the input signal $V_i$ are suppressed. In addition, when the power or energy of the low band frequency signal components included in the input voice signal $V_i$ is low, the cut-off frequency is low, and the low band frequency signal components passing through this SCF 11 are increased. It is shown in FIG. 2B that the cut-off frequency of the SCF 11 is adaptively controlled. That is, when an input signal having a lot of low band frequency components is applied, the cut-off frequency of the SCF 11 is automatically changed to $f_{CH2}$. On the other hand, when an input signal not having a lot of low band frequency signal components is applied, the cut-off frequency thereof is changed to $f_{CH1}$. Therefore, it is understood that the cut-off frequency of the SCF 11 is adaptively controlled in a hatched area in FIG. 2B.

Figure 3:
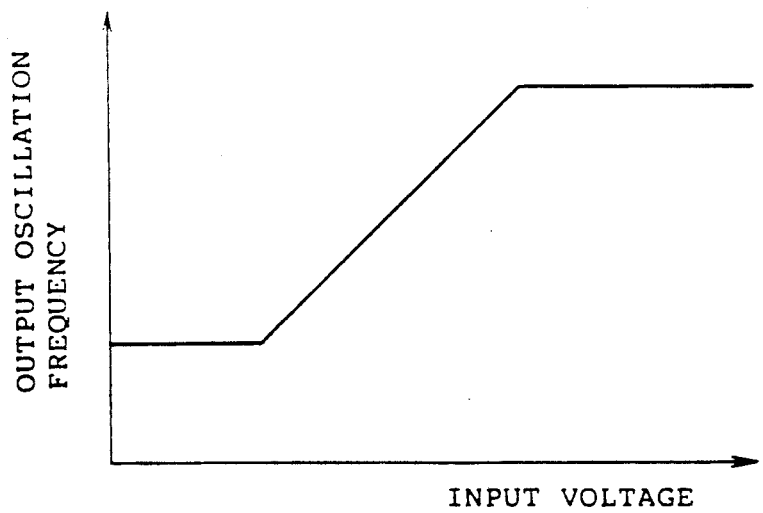
FIG. 3 is a characteristic diagram illustrating input and output characteristics of a voltage controlled oscillator shown in FIG. 1.

FIG. 3 is a characteristic diagram illustrating the input and output characteristics of the VCO 18 shown in FIG. 1. Referring to FIG. 3, an abscissa indicates an input voltage applied to this VCO 18, while an ordinate indicates the oscillating frequency of a clock signal being output. As shown in FIG. 3, the input and output characteristics of the VCO 18 are controlled in order to restrict the upper and lower limits of the cut-off frequency of the SCF 11.

Figure 4:
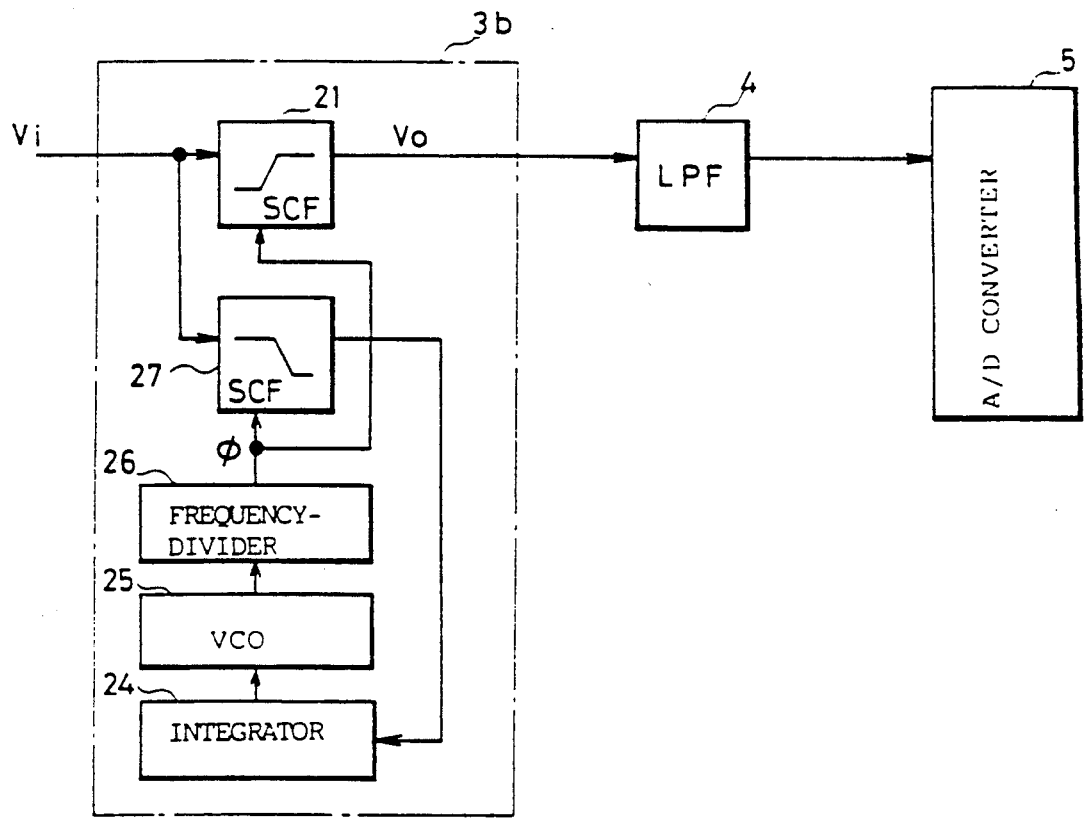
FIG. 4 is a block diagram illustrating another embodiment of the adaptive high pass filter of the present invention.

Referring to FIG. 4, the adaptive high pass filter 3b comprises an SCF 21 as a high pass filter and an SCF 27 as a low pass filter, which are connected to receive an input voice signal $V_i$, an integrator which integrates the output signal of the SCF 27, a VCO 25 connected to the output of the integrator 24, and a frequency divider 26 which frequency-divides a clock signal output from the VCO 25. The clock signal φ output from the frequency divider 26 is supplied to the SCF 21 and 27, respectively.

Since the SCF 21 is operated as a high pass filter, the capacitors 34, 35 and 36 (see FIG. 2A) are employed which satisfy the described expressions (2) and (3). Since the SCF 27 is operated as a low pass filter, the capacitors 34, 35 and 36 are employed which satisfy the following inequality (4) substituted for the inequalities (3).

$$0 < b < 1 \quad (4)$$

As seen above, since the power of low frequency signal components included in the input signal $V_i$ is detected even when the adaptive high pass filter shown in FIG. 4 is employed, the cut-off frequency of the SCF 21 as a high pass filter can be controlled.

Figure 5A:
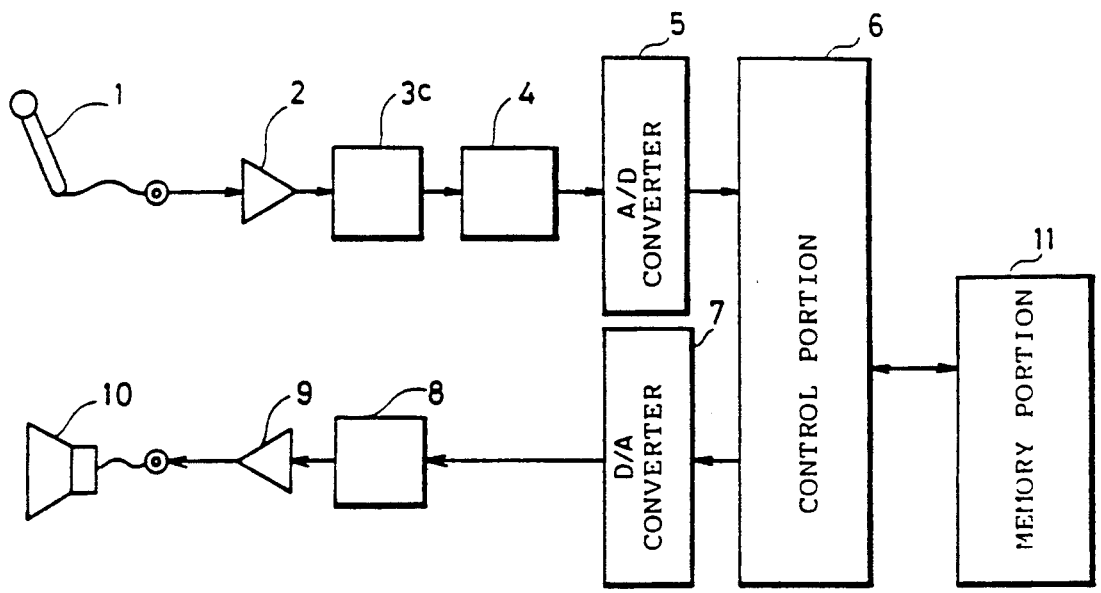
FIG. 5A is a block diagram illustrating the configuration of a conventional sound signal processing apparatus.
Figure 5B:
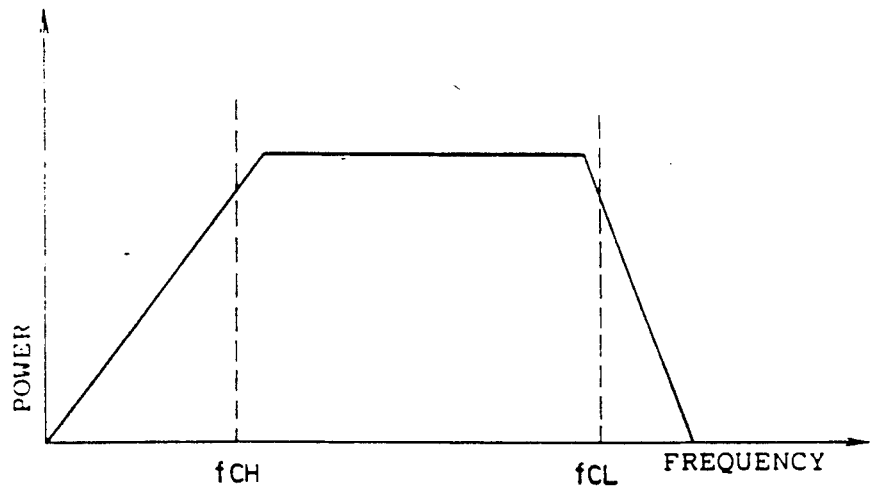
FIG. 5B is a characteristic diagram showing a frequency band fixed by a high pass filter and a low pass filter shown in FIG. 5A.
Figure 6:
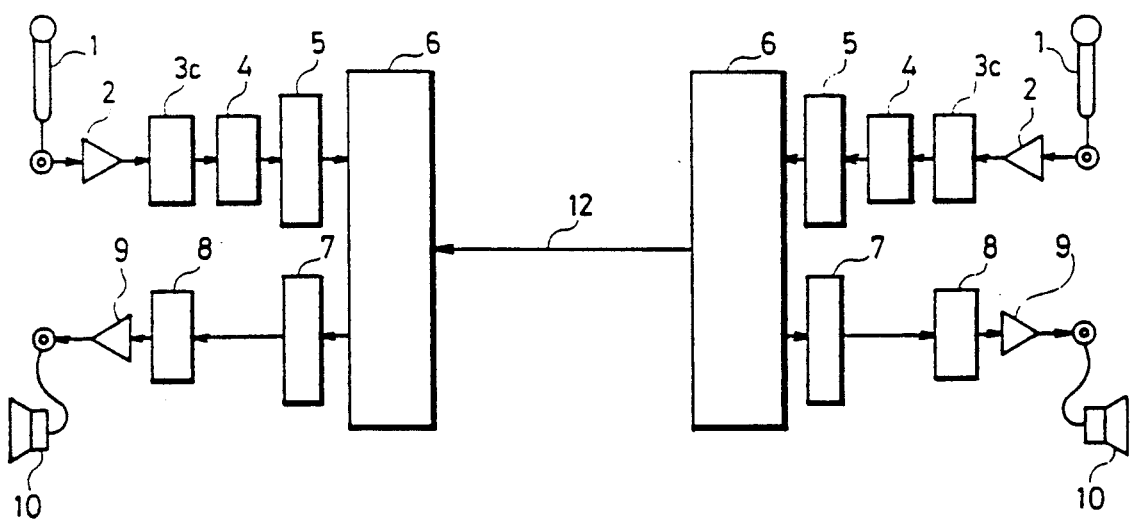
FIG. 6 is a block diagram of the configuration of a conventional sound signal processing system.

Thus, a novel high pass filter for obtaining a digital voice signal not dependent on a quality of voice to be processed, surrounding environments, etc. is provided by applying the adaptive high pass filter shown in FIG. 1 or 4 as a high pass filter, in either the voice signal processing apparatus illustrated in FIG. 5A or the voice signal processing system shown in FIG. 6.

In the embodiments shown in FIGS. 1 and 4, the LPF 4 is connected at the succeeding stage of each of the adapted high pass filters 3a and 3b; however, it should be noted that even the provision of the LPF 4 at the preceding stage of each of the filters 3a and 3b results in the same effect as described above.

As mentioned above, the cut-off frequencies of the adaptive high pass filters 3a, 3b illustrated in FIGS. 1 and 4 are controlled responsive to the power of low frequency signal components included in the input voice signals $V_i$. That is, the cut-off frequency is high when the energy of low frequency signal components included in the input voice signal increases, while the cut-off frequency is low when the energy decreases. As a result, in either the voice processing apparatus or the voice processing system where the adaptive high pass filter 3a, 3b is applied, a quality of tone being reproduced does not vary dependent upon changes in voice qualities of surrounding environments. In other words, a well-articulated reproduced voice can be obtained after being subject to the voice processing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An adaptive high pass filter comprising a switched capacitor filter means having a controllable cut-off frequency controlled in response to the extracted power of low frequency signal components included in a voice input signal having frequencies both higher and lower than said cut-off frequency, said adaptive high pass filter further comprising:
   extracting means connected to receive said voice input signal for extracting the power of low frequency signal components included in said voice input signal, and
   control means responsive to said extracting means for controlling said cut-off frequency of said switched capacitor filter means to regulate the low band power relative to all components of said input voice signal.

2. An adaptive high pass filter in accordance with claim 1, wherein said extracting means comprises
   a first detecting means connected to receive said voice input signal for detecting the power of signal components of a full frequency band included in said voice input signal,
   a second detecting means connected to receive an output signal of said high pass filter means for detecting the power of the output signal of said high pass filter means, and
   a difference evaluating means connected to the outputs of said first and second detecting means for evaluating difference of the power detected by said first and second detecting means.

3. An adaptive high pass filter in accordance with claim 1, wherein said extracting means comprises
   a low pass filter means connected to receive said voice input signal for selectively outputting signal components of a low frequency band included in said voice signal, and
   a detecting means connected to receive an output signal of said low pass filter for detecting the power of the output signal of said low pass filter means.

4. An adaptive high pass filter in accordance with claim 1, wherein said switched capacitor filter means is operable responsive to an output signal output from said control means.

5. An adaptive high pass filter in accordance with claim 4, wherein said control means comprises a clock signal generating means responsive to said extracting means for generating a clock signal, and said switched capacitor filter means is operable responsive to said clock signal generated by said clock signal generating means.

6. An adaptive high pass filter in accordance with claim 5, wherein said clock signal generating means comprises a voltage controlled oscillator means responsive to an output voltage from said extracting means for producing said clock signal.

7. An adaptive high pass filter in accordance with claim 3, wherein said low pass filter means comprises a second switched capacitor filter means operable responsive to the output signal output from said control means.

8. An adaptive high pass filter in accordance with claim 7, wherein said control means comprises a clock signal generating means responsive to said extracting means for generating a clock signal, and said second switched capacitor filter means is operable responsive to said clock signal generated by said clock signal generating means.

9. An adaptive high pass filter in accordance with claim 2, wherein each of said first and second detecting means comprises integrator means, and said difference evaluating means comprises differential amplifier means.

10. A digital voice signal processing system for processing a voice signal having high frequency and low frequency energy components wherein the articulation of sound is improved by the control of the low frequency component of said voice signal, including an analog-to-digital converter having a sampling frequency, a low pass filter for limiting the bandwidth of said voice signal input thereto to a frequency lower than said sampling frequency, and a high pass filter comprising a controllable cut-off frequency filter means for altering the cut-off frequency thereof in response to only the low frequency energy content of said voice signal,
   whereby said high frequency components and low frequency components of said voice signal are adaptively balanced.

11. A method for adaptively balancing high frequency and low frequency energy components of an audio frequency signal in a digital audio frequency signal processing circuit having an analog-to-digital converter and a controllable cut-off frequency high pass filter including the steps of:
   generating a signal having a parameter proportional to the magnitude of only the low frequency energy component of said audio frequency signal, and
   altering the cut-off frequency of said controllable cut-off frequency high pass filter in response to said parameter of said analog signal proportional to said low frequency energy component of said audio frequency signal.

12. In a voice signal processing system for processing a voice signal having high frequency and low frequency energy components, wherein the articulation of sound is improved by the control of the low frequency component of said voice signal, said voice signal processing system including a high pass filter, a low pass filter and a digital-to-analog converter, the improvement comprising:
   said high pass filter being a controllable cut-off frequency type having its cut-off frequency controlled in response to the magnitude of only the low frequency energy component of said audio frequency signal.

13. A voice frequency signal processing system for processing a voice signal to adaptively balance high frequency and low frequency energy components, including a high pass filter comprising a controllable cut-off frequency filter means for altering the cut-off frequency thereof in response to only the low frequency energy content of said audio frequency signal, a low pass filter connected to said high pass filter for limiting the bandwidth of said audio frequency signal input thereto, and an analog-to-digital converter, connected to said low pass filter.

* * * * *